US010163697B2

(12) United States Patent
Anderson et al.

(10) Patent No.: US 10,163,697 B2
(45) Date of Patent: Dec. 25, 2018

(54) METHOD FOR FORMING BEOL METAL LEVELS WITH MULTIPLE DIELECTRIC LAYERS FOR IMPROVED DIELECTRIC TO METAL ADHESION

(71) Applicant: GlobalFoundries Inc., Grand Cayman (KY)

(72) Inventors: Felix P. Anderson, Colchester, VT (US); Edward C. Cooney, III, Jericho, VT (US); Michael S. Dusablon, Milton, VT (US); David C. Mosher, Colchester, VT (US)

(73) Assignee: GLOBALFOUNDRIES INC., Grand Cayman (KY)

(*) Notice: Subject to any disclaimer, the term of this patent is extended or adjusted under 35 U.S.C. 154(b) by 1 day.

(21) Appl. No.: 15/478,385

(22) Filed: Apr. 4, 2017

(65) Prior Publication Data

US 2017/0207121 A1    Jul. 20, 2017

Related U.S. Application Data

(62) Division of application No. 14/749,817, filed on Jun. 25, 2015, now Pat. No. 9,673,091.

(51) Int. Cl.
*H01L 21/4763* (2006.01)
*H01L 21/768* (2006.01)
(Continued)

(52) U.S. Cl.
CPC .. *H01L 21/76877* (2013.01); *H01L 21/02164* (2013.01); *H01L 21/76802* (2013.01);
(Continued)

(58) Field of Classification Search
None
See application file for complete search history.

(56) References Cited

U.S. PATENT DOCUMENTS

| 5,447,887 A | 9/1995 | Filipiak et al. |
| 6,174,793 B1 | 1/2001 | Tsai et al. |
| (Continued) | | |

FOREIGN PATENT DOCUMENTS

| CN | 103839882 A | 6/2014 |
| EP | 1168427 A1 | 1/2002 |

OTHER PUBLICATIONS

Taiwanese Application No. 105108070, Examination Report dated May 16, 2017, pp. 1-13.
(Continued)

*Primary Examiner* — Hung Vu
(74) *Attorney, Agent, or Firm* — Gibb & Riley, LLC; David A. Cain, Esq.

(57) ABSTRACT

Disclosed is a method of forming back end of the line (BEOL) metal levels with improved dielectric capping layer to metal wire adhesion. The method includes process step(s) designed to address dielectric capping layer to metal wire adhesion, when the metal wire(s) in a given metal level are relatively thick. These process step(s) can include, for example: (1) selective adjustment of the deposition tool used to deposit the dielectric capping layer onto metal wires based on the pattern density of the metal wires in order to ensure that those metal wires actually achieve a temperature between 360° C.-400° C.; and/or (2) deposition of a relatively thin dielectric layer on the dielectric capping layer prior to formation of the next metal level in order to reduce the tensile stress of the metal wire(s) below without causing delamination. Also disclosed is an IC chip formed using the above-described method.

14 Claims, 9 Drawing Sheets

(51) Int. Cl.
*H01L 23/532* (2006.01)
*H01L 21/02* (2006.01)

(52) U.S. Cl.
CPC .. *H01L 21/76816* (2013.01); *H01L 21/76832* (2013.01); *H01L 21/76834* (2013.01); *H01L 21/76849* (2013.01); *H01L 21/76852* (2013.01); *H01L 21/76886* (2013.01); *H01L 23/53238* (2013.01)

(56) References Cited

U.S. PATENT DOCUMENTS

| | | | |
|---|---|---|---|
| 6,245,663 B1 | 6/2001 | Zhao et al. | |
| 6,251,775 B1 | 6/2001 | Armbrust et al. | |
| 6,303,505 B1 | 10/2001 | Ngo et al. | |
| 6,339,025 B1 | 1/2002 | Liu et al. | |
| 6,429,128 B1 | 8/2002 | Besser et al. | |
| 6,660,634 B1 | 12/2003 | Ngo et al. | |
| 6,743,310 B1 | 6/2004 | Ngo | |
| 6,803,325 B2 | 10/2004 | M'Saad et al. | |
| 6,821,890 B2 | 11/2004 | McGahay et al. | |
| 6,977,218 B2 | 12/2005 | Yu et al. | |
| 7,157,798 B1 | 1/2007 | Fair et al. | |
| 7,176,571 B2 | 2/2007 | Cheng et al. | |
| 7,202,162 B2 | 4/2007 | Lin et al. | |
| 7,534,732 B1 | 5/2009 | Ngo et al. | |
| 7,678,699 B2 | 3/2010 | Hohage et al. | |
| 8,450,191 B2 | 5/2013 | Wang et al. | |
| 2003/0132510 A1 | 7/2003 | Barth et al. | |
| 2010/0052172 A1* | 3/2010 | Gambino | H01L 21/76802 257/751 |
| 2012/0032333 A1* | 2/2012 | Harada | H01L 21/76826 257/762 |

OTHER PUBLICATIONS

Hymes et al., "Passivation of Copper by Silicide Formation in Dilute Silane", Journal of Applied Physics, 71, 4623, 1992, pp. 1-4, http://dx.doi.org/10.1063/1.350765.

Office Action Communication, U.S. Appl. No. 14/749,817, dated Apr. 15, 2016, pp. 1-5.

Office Action Communication, U.S. Appl. No. 14/749,817, dated Aug. 26, 2016, pp. 1-13.

Office Action Communication, U.S. Appl. No. 14/749,817, dated Jan. 20, 2017, pp. 1-7.

Notice of Allowance, U.S. Appl. No. 14/749,817, dated Mar. 27, 2017, pp. 1-8.

Chinese Application No. 201610258553.6, Search Report dated Aug. 20, 2018, pp. 1-2.

Chinese Application No. 201610258553.6, Office Action dated Aug. 28, 2018, pp. 1-7.

* cited by examiner

| Wire Pattern Density | Pre- SiN Deposition Warm-Up In PECVD Tool |
|---|---|
| <0.25 | 60 seconds |
| $0.25 \leq X < 0.275$ | 55 seconds |
| $0.275 \leq X < 0.30$ | 50 seconds |
| $0.30 \leq X < 0.33$ | 45 seconds |
| $0.33 \geq$ | 40 seconds |

FIG. 7

METHOD FOR FORMING BEOL METAL LEVELS WITH MULTIPLE DIELECTRIC LAYERS FOR IMPROVED DIELECTRIC TO METAL ADHESION

CROSS-REFERENCE TO RELATED APPLICATIONS

The present invention claims the benefit under 35 U.S.C. § 120 as a divisional of U.S. patent application Ser. No. 14/749,817 filed on Jun. 25, 2015, now issued as U.S. Pat. No. 9,673,091 on Jun. 6, 2017, the entire teachings of which are incorporated herein by reference.

FIELD OF THE INVENTION

The present invention relates to back end of the line (BEOL) metal levels on an integrated circuit (IC) chip and, more specifically, to a metal level formation method and an IC chip having a BEOL metal level with improved dielectric to metal adhesion.

BACKGROUND

More particularly, integrated circuit (IC) chips are formed with back end of the line (BEOL) metal levels. Each metal level can comprise metal wires (e.g., copper wires) that fill trenches with a layer of interlayer dielectric (ILD) material. Typically, at each metal level, the metal wires and adjacent ILD material will be capped with a dielectric capping layer (e.g., a silicon nitride capping layer), which minimizes electromigration (EM) and functions as an etch stop layer during formation of upper metal levels. In any case, these metal wires can function as interconnects, which provide electrical connections to on-chip devices (e.g., through vias and/or other metal wires) and/or to off-chip devices (e.g., through vias, other metal wires and/or input/output pins). Additionally, these metal wires can function as passive devices, such as inductors or resistors, or components thereof. Recently, passive devices with very thick metal wires (e.g., metal wires with a height that is greater than 2 µm, metal wires with a height that is greater than 3 µm, etc.) have been incorporated into IC chip designs. Unfortunately, the resulting IC chips tend to exhibit a relatively high rate of occurrence of delamination of the metal wires from the dielectric capping layer above and, thereby exhibit a relatively high fail rate due to opens and other structural defects resulting from the delamination. Thus, there is a need in the art for a BEOL metal level formation method that can provide relatively thick metal wires without a corresponding increase in the rate of occurrence for delamination.

SUMMARY

In view of the foregoing, disclosed herein are embodiments of a method of forming back end of the line (BEOL) metal levels with improved dielectric capping layer to metal wire adhesion. The embodiments include one or more process steps that are designed to address dielectric capping layer to metal wire adhesion, when the metal wire(s) in a given metal level are relatively thick (e.g., >1 µm, >2 µm, >3 µm, >5 µm, etc.). These process steps can include, for example: (1) selective adjustment of the deposition tool that is used to deposit the dielectric capping layer onto metal wires based on the pattern density of the metal wires in order to ensure that those metal wires actually achieve a temperature between 360° C.-400° C.; and/or (2) deposition of a relatively thin dielectric layer onto the dielectric capping layer prior to formation of the next metal level in order to reduce the tensile stress of the metal wire(s) below without causing delamination. Also disclosed herein are embodiments of an IC chip that is formed using the above described method embodiments and that thereby has a BEOL metal level with improved dielectric capping layer to metal wire adhesion.

More specifically, an embodiment of a method of forming BEOL metal levels with improved dielectric capping layer to metal wire adhesion can comprise forming a metal level above a substrate. Specifically, a first dielectric layer, having a first thickness, can be formed above the substrate. A trench can be formed in the first dielectric layer. The trench can be relatively deep (e.g., >1 µm, >2 µm, >3 µm, >5 µm, etc.) and can be filled with a metal material, thereby forming relatively thick metal wire. A second dielectric layer (referred to herein as a dielectric capping layer) can be formed on the first dielectric layer. The second dielectric layer can be formed so that it has a second thickness, so that it extends over the trench and so that it is immediately adjacent to the metal wire contained therein. Next, a third dielectric layer, having a third thickness, can be formed on the second dielectric layer. The first thickness of the first dielectric layer, as well as the depth of the trench, can be relatively large and, specifically, greater than both the second thickness of the second dielectric layer and the third thickness of the third dielectric layer. That is, both the second dielectric layer and the third dielectric layer can be relatively thin. Subsequently, an additional metal level can be formed on the third dielectric layer.

In a more specific embodiment, the metal level formed can comprise a silicon nitride capping layer over copper wires and the method can specifically be design to improve silicon nitride capping layer to copper wire adhesion. That is, this embodiment of the method can comprise forming a metal level above a substrate. Specifically, a first dielectric layer, having a first thickness, can be formed above the substrate. Trenches can be formed in the first dielectric layer. These trenches can be relatively deep (e.g., >1 µm, >2 µm, >3 µm, >5 µm, etc.) and can be filled with copper, thereby forming relatively thick copper wires. A second dielectric layer (referred to herein as a dielectric capping layer) can be formed on the first dielectric layer. The second dielectric layer can comprise a silicon nitride layer and can be formed so that it has a second thickness, so that it extends over the trenches and so that it is immediately adjacent to the copper wires contained therein. More specifically, this second dielectric layer (i.e., the silicon nitride layer) can be formed using a plasma-enhanced chemical vapor deposition process that results in self-aligned copper silicide layers being formed in the upper portions of the trenches at the interfaces between the silicon nitride layer and the copper wires. These copper silicide layers provide for better adhesion between the second dielectric layer and the copper wires below, thereby minimizing delamination of the second dielectric layer from the copper wires below. Next, a third dielectric layer, having a third thickness, can be formed on the second dielectric layer. The first thickness of the first dielectric layer, as well as the depth of the trenches, can be relatively large and, specifically, greater than both the second thickness of the second dielectric layer and the third thickness of the third dielectric layer. That is, both the second dielectric layer and the third dielectric layer can be relatively thin. Subsequently, an additional metal level can be formed on the third dielectric layer.

In an even more specific embodiment, the metal level formed can comprise a silicon nitride capping layer over copper wires and the method can specifically be design to improve silicon nitride capping layer to copper wire adhesion by selectively adjusting the tool used to deposit the silicon nitride capping layer based on the pattern density of those copper wires in order to ensure that copper wires achieve a temperature between 360° C.-400° C. during capping layer deposition. That is, this embodiment of the method can comprise forming a metal level above a substrate. Specifically, a first dielectric layer, having a first thickness, can be formed above the substrate. Trenches can be formed in the first dielectric layer. These trenches can be relatively deep (e.g., >1 µm, >2 µm, >3 µm, >5 µm, etc.) and can be filled with copper, thereby forming relatively thick copper wires. A second dielectric layer (referred to herein as a dielectric capping layer) can be formed on the first dielectric layer. The second dielectric layer can comprise a silicon nitride layer and can be formed so that it has a second thickness, so that it extends over the trenches and so that it is immediately adjacent to the copper wires contained therein. More specifically, this second dielectric layer (i.e., the silicon nitride layer) can be formed using a plasma-enhanced chemical vapor deposition process that results in self-aligned copper silicide layers being formed in the upper portions of the trenches at the interfaces between the silicon nitride layer and the copper wires. In this case, plasma exposure time used during the plasma-enhanced chemical vapor deposition process can be set based on the pattern density of the copper wires in order to ensure that the copper wires achieve a temperature between 360° C.-400° C. during capping layer deposition and, thereby in order to ensure that the resulting copper silicide layers fill at least the upper 1-3% of each of the trenches. Thus, in cases where the trenches are, for example, approximately 3 µm deep, the copper silicide layers will be approximately 30-90 nm thick. The relatively thick copper silicide layers provide for even better adhesion between the second dielectric layer and the copper wires below, thereby minimizing delamination of the second dielectric layer from the copper wires below. Next, a third dielectric layer, having a third thickness, can be formed on the second dielectric layer. The first thickness of the first dielectric layer, as well as the depth of the trenches, can be relatively large and, specifically, greater than both the second thickness of the second dielectric layer and the third thickness of the third dielectric layer. That is, both the second dielectric layer and the third dielectric layer can be relatively thin. Subsequently, an additional metal level can be formed on the third dielectric layer.

It should be noted that in each of the above-described methods the process of depositing the third dielectric layer effectively heats the metal wire(s) below (e.g., the copper wire(s) below) causing them to expand and, thereby reducing the tensile stress exhibit by the wire(s). Reducing the tensile stress reduces the pull downward by the metal wire(s) against the second dielectric layer (i.e., against the dielectric capping layer). Since this process which heats the metal wire(s) to reduce tensile stress is performed prior to formation of an additional metal level, which is relatively thick and un-flexible, and since it results in only a thin third dielectric layer being formed, when the metal wire(s) eventually cool and contract the thin third dielectric layer can flex minimizing the opposing forces that could result in delamination of the second dielectric layer from the metal wire(s) below.

Also disclosed herein are embodiments of an IC chip that is formed using the above described method embodiments and that thereby has a BEOL metal level with improved dielectric capping layer to metal wire adhesion.

Specifically, an embodiment of an IC chip structure can comprise a substrate and a metal level above the substrate. The metal level can comprise a first dielectric layer, having a first thickness, a bottom surface and a top surface opposite the bottom surface. A trench can extend vertically into the first dielectric layer from the top surface and a metal material can fill the trench, thereby forming a metal wire. A second dielectric layer (referred to herein as a dielectric capping layer), having a second thickness, can be above and immediately adjacent to the top surface of the first dielectric layer. This second dielectric layer can further extend over the trench and can be immediately adjacent to the metal wire contained therein. A third dielectric layer, having a third thickness, can be above and immediately adjacent to the second dielectric layer. The first thickness of the first dielectric layer, as well as the depth of the trench, can be relatively large and, specifically, greater than both the second thickness of the second dielectric layer and the third thickness of the third dielectric layer. That is, both the second dielectric layer and the third dielectric layer can be relatively thin. An additional metal level can be above and immediately adjacent to the third dielectric layer.

In a more specific embodiment, the metal level in the IC chip structure can comprise a silicon nitride capping layer over copper wires and can be formed so as to have improve silicon nitride capping layer to copper wire adhesion. Specifically, this embodiment of an IC chip structure can comprise a substrate and a metal level above the substrate. The metal level can comprise a first dielectric layer, having a first thickness, a bottom surface and a top surface opposite the bottom surface. Trenches can extend vertically into the first dielectric layer from the top surface and copper can fill the trenches, thereby forming copper wires. A second dielectric layer (referred to herein as a dielectric capping layer), having a second thickness, can be above and immediately adjacent to the top surface of the first dielectric layer. This second dielectric layer can further extend over the trench and can be immediately adjacent to the metal wire contained therein. The second dielectric layer can comprise, for example, silicon nitride layer and, due to the process used when forming this silicon nitride layer, the IC chip structure can further comprise self-aligned copper silicide layers at the interfaces between the silicon nitride layer and the copper wires. The copper silicide layers can, for example, fill at least the upper 1-3% of each of the trenches. Thus, in cases where the trenches are, for example, approximately 3 µm deep, the copper silicide layers will be approximately 30-90 nm thick. The relatively thick copper silicide layers provide for better adhesion between the second dielectric layer and the copper wires below, thereby minimizing delamination of the second dielectric layer from the copper wires below. A third dielectric layer, having a third thickness, can be above and immediately adjacent to the second dielectric layer. The first thickness of the first dielectric layer, as well as the depth of the trench, can be relatively large and, specifically, greater than both the second thickness of the second dielectric layer and the third thickness of the third dielectric layer. That is, both the second dielectric layer and the third dielectric layer can be relatively thin. An additional metal level can be above and immediately adjacent to the third dielectric layer.

It should be noted that in each of the above-described IC chip structures the thin third dielectric layer is flexible during processing prior to formation of the additional metal level, thereby allowing the metal wire(s) below to expand and contract without significant opposing forces being exerted at the interface(s) between the second dielectric layer and the metal wire(s) Thus, formation of this third dielectric layer between the second dielectric layer and the additional metal level, minimizes delamination of the second dielectric layer from the metal wire(s) below.

BRIEF DESCRIPTION OF THE SEVERAL VIEWS OF THE DRAWINGS

The present invention will be better understood from the following detailed description with reference to the drawings, which are not necessarily drawn to scale and in which:

FIG. 7 is an exemplary look-up table (LUT) that can be used in conjunction with the method of FIG. 1;

DETAILED DESCRIPTION

Figure 1:
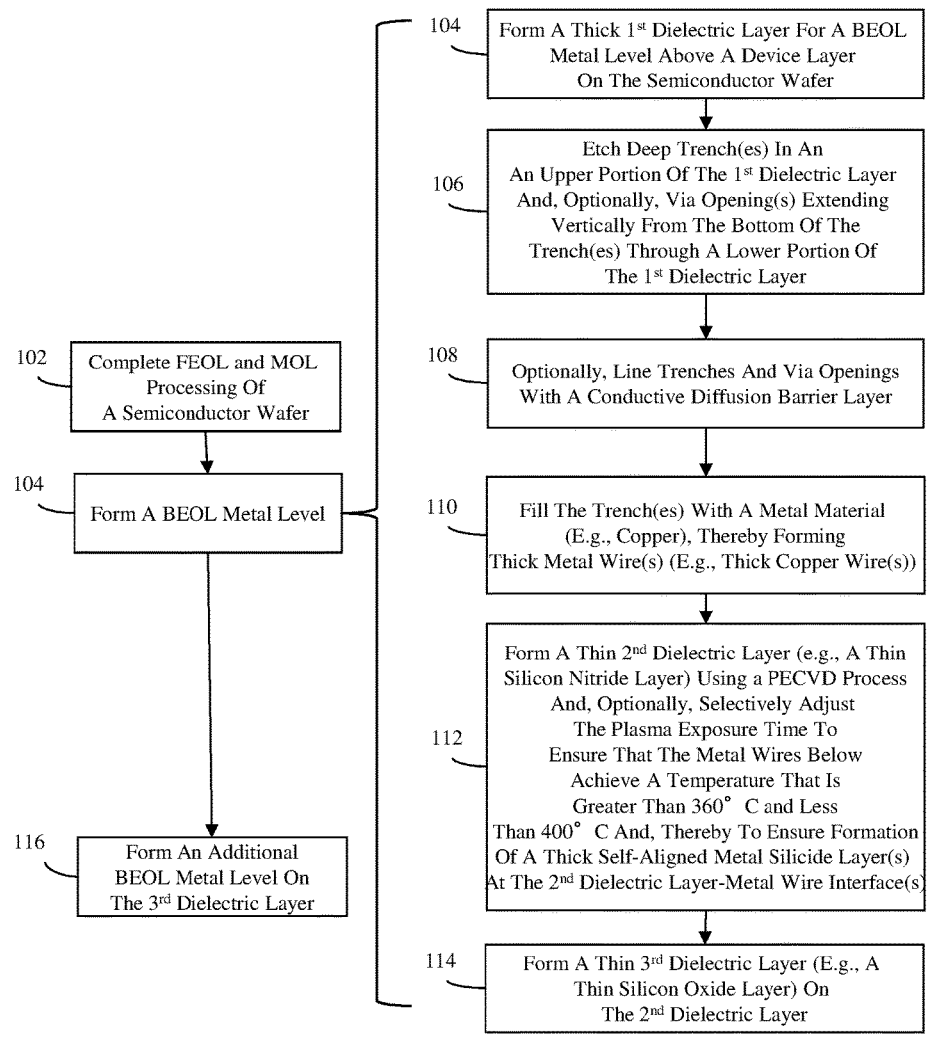
FIG. 1 is a flow diagram illustrating a method of forming BEOL metal levels with improved dielectric capping layer to metal wire adhesion.

As mentioned above, integrated circuit (IC) chips are formed with back end of the line (BEOL) metal levels. Each metal level can comprise metal wires (e.g., copper wires) that fill trenches with a layer of interlayer dielectric (ILD) material. Typically, at each metal level, the metal wires and adjacent ILD material will be capped with a dielectric capping layer (e.g., a silicon nitride capping layer), which minimizes electromigration (EM) and functions as an etch stop layer during formation of upper metal levels. In any case, these metal wires can function as interconnects, which provide electrical connections to on-chip devices (e.g., through vias and/or other metal wires) and/or to off-chip devices (e.g., through vias, other metal wires and/or input/output pins). Additionally, these metal wires can function as passive devices, such as inductors or resistors, or components thereof. Recently, passive devices with very thick metal wires (e.g., metal wires with a height that is greater than 2 µm, metal wires with a height that is greater than 3 µm, metal wires with a height that is greater than 5 µm, etc.) have been incorporated into IC chip designs. Unfortunately, the resulting IC chips tend to exhibit a relatively high rate of occurrence of delamination of the metal wires from the dielectric capping layer above and, thereby exhibit a relatively high fail rate due to opens and other structural defects resulting from the delamination. Thus, there is a need in the art for a BEOL metal level formation method that can provide relatively thick metal wires without a corresponding increase in the rate of occurrence for delamination.

Those skilled in the art will recognize that the high rate of occurrence of delamination is due to a reduction in adhesion of the dielectric capping layer to the thick metal wires below. In developing techniques for minimizing the occurrence of delamination, the present inventors have found three distinct factors that effect dielectric capping layer to metal wire adhesion: (1) the thickness of the metal wires onto which the dielectric capping layer is deposited; (2) the pattern factor of the metal wires onto which the dielectric capping layer is deposited and, thereby the temperature of the metal wires during deposition of the dielectric capping layer; and (3) the thickness of the next layer of ILD material for the next metal level above and immediately adjacent to the dielectric capping layer. Specifically, the present inventors have found that metal wires tend to exhibit tensile stress, causing those metal wires to pull downward and away from the dielectric capping layer. The amount of tensile stress exhibited by a metal wire is a function of the thickness of the metal wire with relatively thick metal wires (e.g., metal wires with a height that is greater than 2 µm, metal wires with a height that is greater than 3 µm, metal wires with a height that is greater than 5 µm, etc.) exhibiting a sufficient amount of stress to cause delamination with current metal level configurations. The present inventors have further found that there is a significant correlation between the pattern density of the metal wires onto which the dielectric capping layer is deposited and adhesion of the dielectric capping layer to those metal wires and that this correlation is due to the temperatures of the metal wires achieved during deposition of the dielectric capping layer. Specifically, the present inventors have found that, when the pattern density of the metal wires is relatively low, the temperature of the metal wires achieved during BEOL plasma-enhanced chemical vapor deposition (PECVD) (e.g., high density plasma chemical vapor deposition (HDPCVD)) of the dielectric capping layer over exposed metal wires will also be relatively low and, thus, adhesion of the dielectric capping layer to the metal wires will be relatively low and the rate of occurrence of delamination will be relatively high. The present inventors have further found that, when the pattern density of the metal wires is relatively high, the temperature of the metal wires achieved during BEOL PECVD (e.g., HDPCVD) of the dielectric capping layer over exposed metal wires will also be relatively high and, thus, adhesion of the dielectric capping layer to the metal wires will be relatively high and the rate of occurrence of delamination will be relatively low. Lastly, the present inventors have found that there is also a significant correlation between the thickness of the ILD material deposited onto the dielectric capping layer and adhesion of the dielectric capping layer to the metal wires below and that this correlation is due to the lack of expansion and contraction of the ILD material. Specifically, a relatively thick ILD layer is typically deposited on and immediately adjacent to the dielectric capping layer of a lower metal level. This thick ILD layer is then patterned with trenches for the metal wires of the next metal level. The present inventors have found that, during the ILD deposition process, the substrate is heated and, as a result, the metal wires in the metal level below this ILD material will expand. When the metal wires begin to cool, they will contract. This expansion and contraction process has the benefit of reducing tensile stress in the metal wires. However, when the ILD layer is relatively thick, it will not flex or will exhibit only minimal flexing as the metal wires below expand and contract. Consequently, the thick ILD layer and metal wires act as opposing forces that can result in delamination at the interface between the dielectric capping layer and metal wires.

In view of the foregoing, disclosed herein are embodiments of a method of forming back end of the line (BEOL) metal levels with improved dielectric capping layer to metal wire adhesion. The embodiments include one or more process steps that are designed to address dielectric capping layer to metal wire adhesion, when the metal wire(s) in a given metal level are relatively thick (e.g., >1 µm, >2 µm, >3 µm, >5 µm, etc.). These process steps can include, for example: (1) selective adjustment of the deposition tool that is used to deposit the dielectric capping layer onto metal wires based on the pattern density of the metal wires in order to ensure that those metal wires actually achieve a temperature between 360° C.-400° C.; and/or (2) deposition of a relatively thin dielectric layer onto the dielectric capping layer prior to formation of the next metal level in order to reduce the tensile stress of the metal wire(s) below without causing delamination. Also disclosed herein are embodiments of an IC chip that is formed using the above described method embodiments and that thereby has a BEOL metal level with improved dielectric capping layer to metal wire adhesion.

More specifically, FIG. 1 is a flow diagram illustrating a method of forming BEOL metal levels with improved dielectric capping layer to metal wire adhesion.

The method can comprise completing front end of the line (FEOL) processing and middle of the line (MOL) processing of a semiconductor wafer in order to form an integrated circuit (IC) device layer on a substrate (102). The details of FEOL processing and MOL processing are well known in the art and, thus, are omitted from this specification in order to allow the reader to focus on the salient aspects of the disclosed method.

Figure 2:
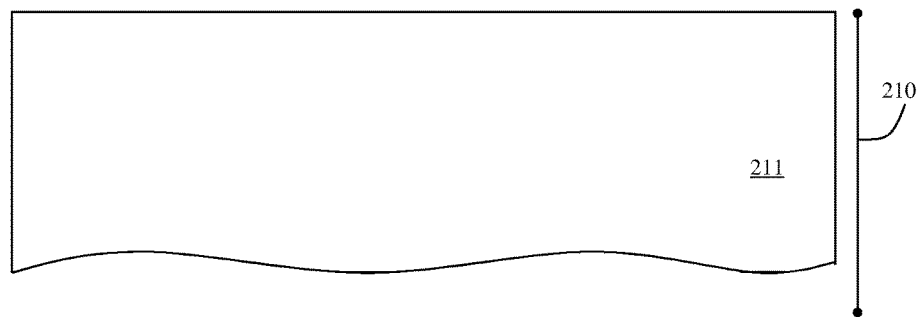
FIG. 2 is a cross-section diagram illustrating a partially completed structure formed according to the method of FIG. 1.

During BEOL processing, a metal level, with relatively thick metal wire(s), can be formed above the device layer and, thereby above the substrate (104). It should be noted that this metal level can be the first metal level (i.e., M-1) above the device layer or some other metal level above the device layer. In any case, this metal level can be formed by forming a first dielectric layer 211 (104, see FIG. 2). This first dielectric layer 211 can be formed using a chemical vapor deposition (CVD) process (e.g., a plasma-enhanced chemical vapor deposition (PECVD) process, such as a high-density plasma chemical vapor deposition (HDPCVD) process), a spin coating process or any other suitable deposition process. This first dielectric layer 211 can comprise, for example, a silicon dioxide ($SiO_2$) layer or any other suitable interlayer dielectric material (e.g., borophosphosilicate glass (BPSG), tetraethyl orthosilicate (TEOS), fluorinated tetraethyl orthosilicate (FTEOS), etc.). This first dielectric layer 211 can be deposited such that it has a 210, which ranges, for example, from 1-8 µm such that it can accommodate relatively thick metal wire(s) (e.g., metal wire(s) having a thickness of 1-8 µm, as discussed in greater detail below).

Figure 3:
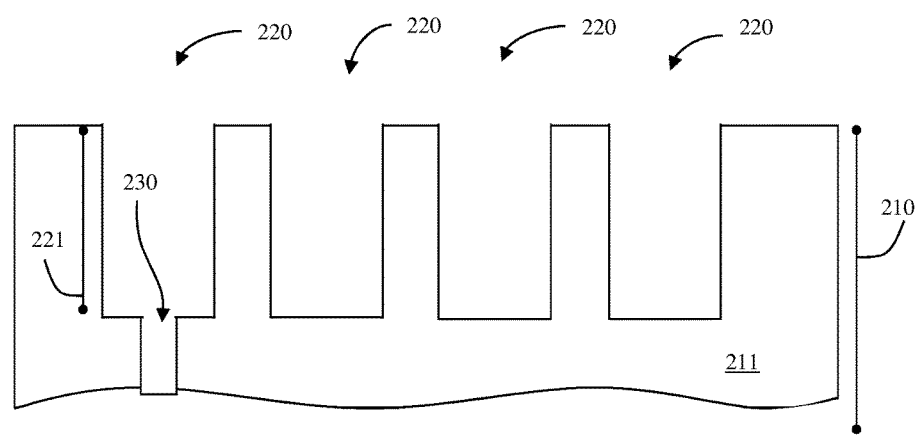
FIG. 3 is a cross-section diagram illustrating a partially completed structure formed according to the method of FIG. 1.

Then, damascene and/or dual-damascene techniques can be used to form one or more trenches 220 (i.e., wiring grooves) and, optionally, one or more via openings 230 (106, see FIG. 3). For purpose of illustration, FIG. 3 shows dual-damascene processing being performed to form both trench(es) and via opening(s). However, FIG. 3 is not intended to be limiting. That is, it should be understood that, alternatively, only damascene processing can be performed to form only trench(es) and not via opening(s). In any case, trench(es) 220 can be formed that extend vertically a predetermined depth 221 into the first dielectric layer 211 from the top surface of the first dielectric layer 211. Each via opening 230 (if any) can be formed so as to extend vertically from a bottom of a trench 220 down to a lower metal level or to the device layer (not shown). Such damascene and dual-damascene techniques are well known in the art and, thus, are omitted from this specification in order to allow the reader to focus on the salient aspects of the disclosed method. The etch depth of the trenches 220 can be predetermined based on the desired thickness of the resulting wires (e.g., between 1-8 µm, such as 3 µm, as discussed in greater detail below).

Figure 4:
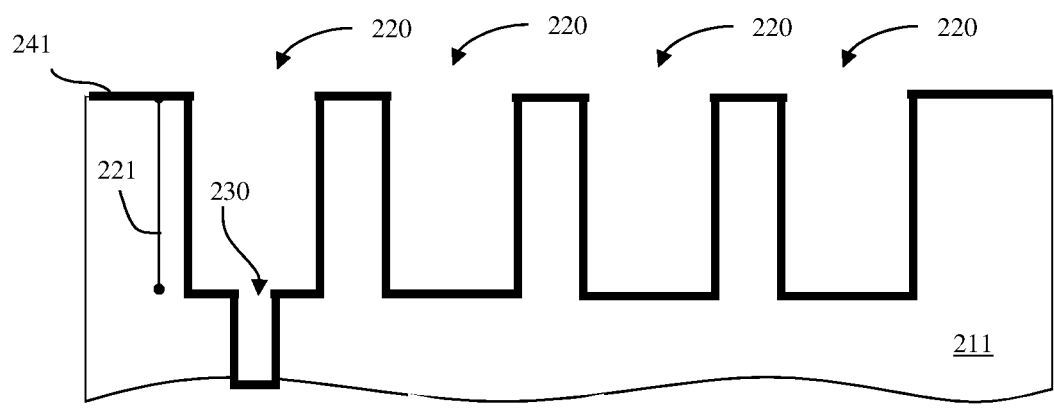
FIG. 4 is a cross-section diagram illustrating a partially completed structure formed according to the method of FIG. 1.

Once the trench(es) 220 and any via opening(s) 230 are formed, they can optionally be lined (e.g., conformally or directionally) with a conductive diffusion barrier layer 241 (108, see FIG. 4). That is, any suitable conductive material that exhibits high atomic diffusion resistance (i.e., a conductive diffusion barrier material that exhibits low atomic diffusivity) can be deposited, using conventional deposition techniques (e.g., physical vapor deposition (PVD), chemical vapor deposition (CVD), or other suitable technique) onto the bottom surface and sidewalls of the trench(es) 220 and any via opening(s) 230. Such a conductive diffusion barrier layer 241 can have a thickness ranging, for example, from 200-2000 Angstroms and can comprise a cobalt layer, a chromium layer, a ruthenium layer, a tantalum layer, a tantalum nitride layer, an indium oxide layer, a tungsten layer, a tungsten nitride layer, a titanium layer, a titanium nitride layer, or any other suitable conductive barrier material as described above.

Figure 5:
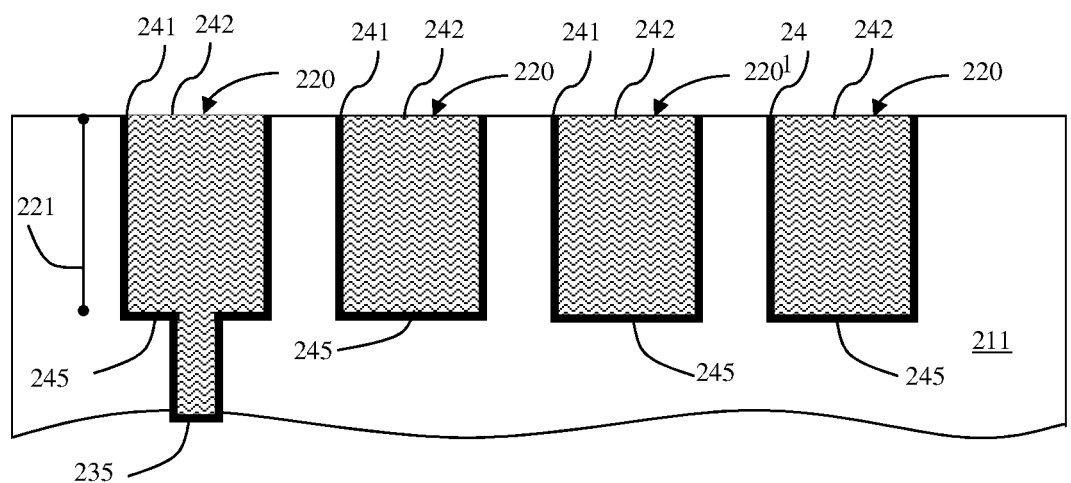
FIG. 5 is a cross-section diagram illustrating a partially completed structure formed according to the method of FIG. 1.

Next, the trench(es) 220 and any via opening(s) 230 can be filled with a metal material 242, thereby forming relatively thick metal wire(s) 245 and, if applicable, connecting via(s) 235 (110, see FIG. 5). This metal material can comprise, for example, copper. Alternatively, the metal material can comprise any suitable metal material for metal level wire formation. In any case, the metal wire(s), which as discussed above are relatively thick due to the depth of the trench(es), can comprise connecting wires or, alternatively, can comprise passive devices, such as inductors or resistors, or components thereof, which have been incorporated into the IC chip design. Following deposition of the metal material, all conductive material can be removed from the top surface of the first dielectric layer 211 (e.g., using a chemical mechanical polishing (CMP) process).

Figure 6A:
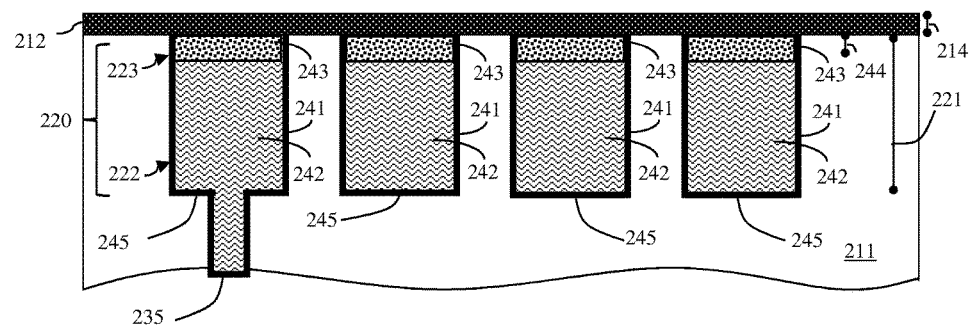
FIG. 6A is a cross-section diagram illustrating a partially completed structure formed according to the method of FIG. 1.

Then, a second dielectric layer 212 (referred to herein as a dielectric capping layer) can be formed on the first dielectric layer 211 (112, see FIG. 6A). The second dielectric layer 212 can comprise, for example, a silicon nitride layer, a silicon oxynitride layer, or any other suitable dielectric capping layer. The second dielectric layer 212 can be deposited so that it has a second thickness 214. This second thickness 214 can be less than the depth 221 of the trench(es) 220 and, thereby less than the thickness of the first dielectric layer 211. For example, the second thickness 214 can be less than 20% and, more particularly, less than 10% of the depth 221 of the trench(es) 220. For example, the second thickness 214 of the second dielectric layer 212 can range from 20-200 nm or, more particularly, from 50-70 nm.

In any case, this second dielectric layer 212 can be deposited so that it is immediately adjacent to the first dielectric layer 211 and so that it extends over the trench(es) 220 and is immediately adjacent to the metal wire(s) 245 (e.g., the copper wire(s)) contained therein. This second dielectric layer 212 can be deposited using, for example, a plasma-enhanced chemical vapor deposition (PECVD) process, such as a high density plasma chemical vapor deposition (HDPCVD) process that results in the formation of self-aligned metal silicide layer(s) 243 (e.g., self-aligned copper silicide layers when the metal wire(s) 245 are copper wire(s)) in the upper portion(s) 223 of the trench(es) 220 at the interface(s) between the second dielectric layer 212 (e.g., the silicon nitride layer) and the metal wire(s) 245 (e.g., the copper wire(s)). The self-aligned metal silicide layer(s) 243 (e.g., the copper silicide layer(s)) provide for better adhesion between the second dielectric layer 212 (e.g., the silicon nitride layer) and the metal wire(s) 245 (e.g., the copper wire(s)) below, thereby minimizing delamination.

Those skilled in the art will recognize that a PECVD system will typically include a chamber. The upper portion of the chamber comprises a dome and the lower portion comprises a substrate support surface. The dome defines the upper boundary of a plasma processing region and the substrate support surface defines the lower boundary of the plasma processing region. A vacuum system can adjust the pressure in the system. A plasma source system can generate plasma within the plasma processing region. Optionally, a temperature control system can comprise a heat and/or cooling plate at the substrate support surface. A gas delivery system allows for input of one or more different gasses into the plasma within the plasma processing region. A control system can be operably connected to each of these systems (e.g., the vacuum system, the plasma source system, the temperature control system (if applicable) and the gas delivery system) can be control operation of the system. For PECVD using such a PECVD system, a wafer is placed on the substrate support surface and, particularly, transferred into the chamber (e.g., by a robot blade) through an insertion/removal opening in the side of the chamber and places on the substrate support surface. The plasma is generated and the gases required for the composition of the layer being deposited are input into the plasma. Those skilled in the art will recognize that, when a wafer is with the chamber and exposed to plasma, it will heat up. Additionally, variations in the power imparted on the plasma will cause variations in the plasma energy and, thereby variations in the rate at which the wafer heats up. Thus, although the temperature of the plasma can not be directly controlled, the power imparted on the plasma can be controlled in order to indirectly control the temperature of the plasma. Consequently, the composition of the plasma and/or the power imparted on the plasma can be selectively adjusted in order to selectively adjust the composition of the layer being deposited. For example, for a silicon nitride layer, the plasma can comprise hydrogen ($H_2$) plasma. The gas delivery system can flow both nitrogen and silane ($SiH_4$) can into the chamber. The vacuum system can set the pressure in the chamber so that it is within the range of 2-3 Torr (e.g., 2.6 Torr). Additionally, the power imparted on the plasma by the plasma source system can be set to ensure that the wafer, when exposed to the plasma over time, can be heated to a temperature in the range of 360° C.-400° C. (e.g., 380° C.).

The present inventors have found that, when the pattern density of the metal wires is relatively high (e.g., greater than 33%), the exposed metal wires 245 onto which the second dielectric layer 212 is being deposited will achieve a temperature within this range of 360° C.-400° C. (e.g., 380° C.) during the time required for deposition. However, when the pattern density of the metal wires 245 is relatively low (e.g., lower than 33%), the exposed metal wires 245 onto which the second dielectric layer 212 is being deposited will not achieve a temperature within the range of 360° C.-400° C. For purpose of this disclosure, the "pattern density" of the metal wires refers to the ratio of metal to dielectric material at the exposed surface onto which the second dielectric layer 212 is being deposited. Thus, a pattern density that is greater than 33% means that the ratio of metal to dielectric material is greater than ⅓. Greater thermal coupling of the metal wires with a higher pattern density as compared to lesser thermal coupling of metal wires with a lower pattern density is likely the cause of the temperature difference.

In any case, the present inventors have further found that a metal wire temperature range of 360° C.-400° C. (e.g., a copper wire temperature range of 360° C.-400° C.) ensures that the resulting self-aligned metal silicide layer(s) 243 (e.g., the resulting self-aligned copper silicide layers) will be relatively thick. That is, the metal silicide layer(s) 243 will have a thickness 244 that is 1-3% of the depth 221 of the trench(es) 220. For example, if thick copper wire(s) in trench(es) 220 that are 3 μm deep achieve a temperature within the range of 360° C.-400° C. (e.g., 380° C.) during PECVD of a second dielectric layer 212 (e.g., during deposition of a silicon nitride layer), then the resulting self-aligned copper silicide layer(s) 243 will be 30-90 nm thick. A copper silicide layer that is 30-90 nm thick will optimize adhesion of the silicon nitride layer to the copper wire below and will, thereby minimize delamination.

Figure 6B:
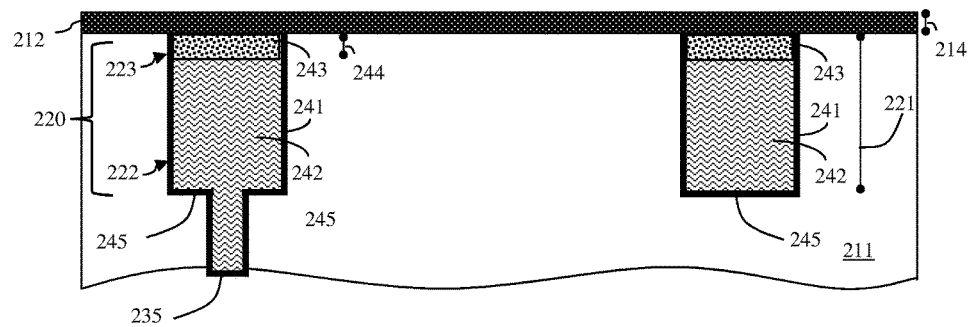
FIG. 6B is a cross-section diagram illustrating an alternative partially completed structure formed according to the method of FIG. 1, when the metal wire pattern density is low.

Since metal wires with a low pattern density (e.g., a pattern density of less than 33%) do not achieve the temperature range of 360° C.-400° C. during normal PECVD processing, the method disclosed herein provides that during this process 112 of forming the second dielectric layer 212, the PECVD tool used to deposit the second dielectric layer 212 (e.g., the silicon nitride layer) and, particularly, the settings on that tool can be selectively adjusted based on the pattern density of the metal wires 245 (e.g., the pattern density of the copper wires) in order to ensure that metal wires 245 (e.g., the copper wires) achieve the desired temperature within the range of 360° C.-400° C. during deposition of the second dielectric layer 212 (e.g., the silicon nitride layer). For example, one technique for ensuring that metal wires 245 (e.g., the copper wires) with a low pattern density (e.g., as shown in FIG. 6B) achieve the desired temperature within the range of 360° C.-400° C. during deposition of the second dielectric layer 212 thereon can comprise providing a warm up period within the PECVD chamber. For example, depending upon the pattern density of the metal wires, different H2-plasma exposure times can be instituted prior to flowing the nitrogen and silane ($SiH_4$) into the chamber and beginning silicon nitride deposition in order to pre-heat the metal wires from above. Additionally and/or alternatively, if the chamber is configured with a heating plate at the substrate support plate this heating plate can be turned on for different periods of time prior to flowing the nitrogen and silane ($SiH_4$) into the chamber and beginning silicon nitride deposition in order to pre-heat the metal wires from above. FIG. 7 is an exemplary LUT table that shows different wire pattern density ranges and corresponding pattern density-specific warm-up times and, particularly, corresponding H2-plasma exposure times. Thus, for example, for a structure with a wire pattern density of less than 0.25, the wafer can be exposed to the H2-plasma for 60 seconds prior to flowing the nitrogen and silane (SiH$_4$) into the chamber and beginning silicon nitride deposition; whereas for a structure with a wire pattern density of 0.25 up to 0.275 the wafer can be exposed to the H2-plasma for 55 seconds prior to flowing the nitrogen and silane (SiH$_4$) into the chamber and beginning silicon nitride deposition; and so. In this example, any structure with a wire pattern density of 0.33 or over would require a warm-up period of 40 seconds. It should be noted that, for illustration purposes, the LUT in FIG. 7 shows different wire pattern density ranges and corresponding pattern density-specific corresponding H2-plasma exposure times. However, FIG. 7 is not intended to be limiting and any number of two or more wire pattern density ranges and corresponding pattern density-specific warm-up times could be used. Furthermore, it should be noted that such a LUT table can be stored in memory and accessed (e.g., by a user or the control system).

Figure 8:
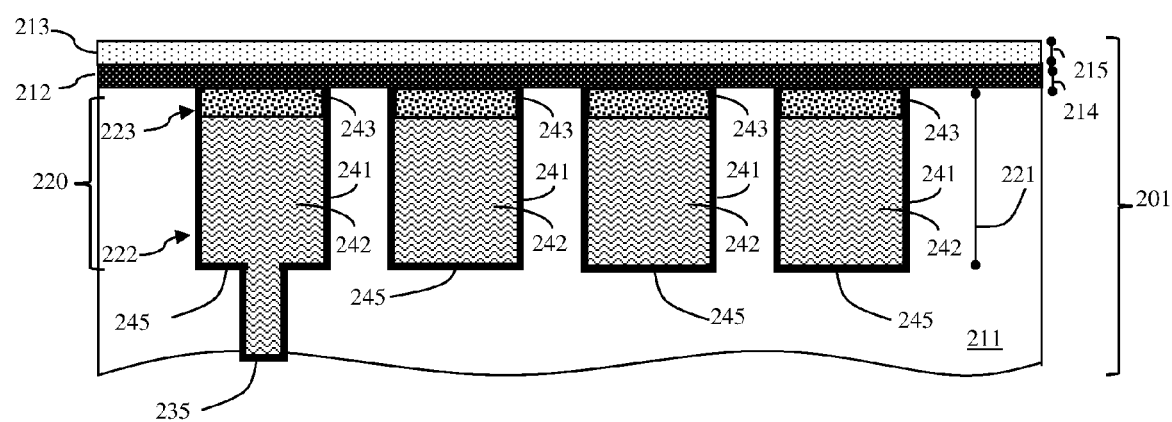
FIG. 8 is a cross-section diagram illustrating a partially completed structure formed according to the method of FIG. 1.

Next, a third dielectric layer 213 can be formed on the second dielectric layer 212 (114, see FIG. 8). The third dielectric layer 213 can comprise, for example, a different dielectric material than that used for the second dielectric layer 212. For example, the third dielectric layer 213 can comprise a silicon oxide layer, a silicon oxynitride layer, a hydrogenated silicon oxycarbide layer, etc. Alternatively, this third dielectric layer 213 can comprise the same dielectric material as the second dielectric layer 212. In any case, this third dielectric layer 213 can be deposited so that it has a third thickness 215. This third thickness 215 can be less than the depth 221 of the trench(es) 220 and, thereby less than the thickness of the first dielectric layer 211. This third thickness 215 can be approximately equal, slightly thicker than or slightly thinner than the second thickness 214 of the second dielectric layer 212. Thus, for example, the third thickness 215 of the third dielectric layer 213 can be less than 20% and, more particularly, less than 10% of the depth 221 of the trench(es) 220. For example, the third thickness 215 of the third dielectric layer 213 can range from 20-200 nm or, more particularly, from 50-70 nm.

In any case, this third dielectric layer 213 can be deposited so that it is immediately adjacent to the second dielectric layer 212. This third dielectric layer 213 can be deposited using, for example, a PECVD process, such as a HDPCVD. Thus, during deposition of the third dielectric layer 213, the metal wire(s) 245 will concurrently be heated causing them to expand and, thereby reducing the tensile stress exhibited by the metal wire(s) 245. By reducing the tensile stress in the metal wire(s) 245, the force exerted by the metal wire(s) 245 downward and away from the second dielectric layer 212 is reduced. Thus, adhesion between the second dielectric layer 212 and the metal wire(s) 245 is improved. It should be noted that, since this process of depositing the third dielectric layer 213 and concurrently heating the metal wire(s) 245 to reduce tensile stress is performed prior to formation of a subsequent metal level, which includes a relatively thick and un-flexible dielectric layer, and since it results in only a thin third dielectric layer being formed, when the metal wire(s) 245 eventually cool and contract, the thin third dielectric layer 213 can flex minimizing the opposing forces that could result in delamination of the second dielectric layer from the metal wire(s) 245 below. Formation of the third dielectric layer 213, as shown in FIG. 8, completes formation of the metal level 201 at process 104.

Figure 9:
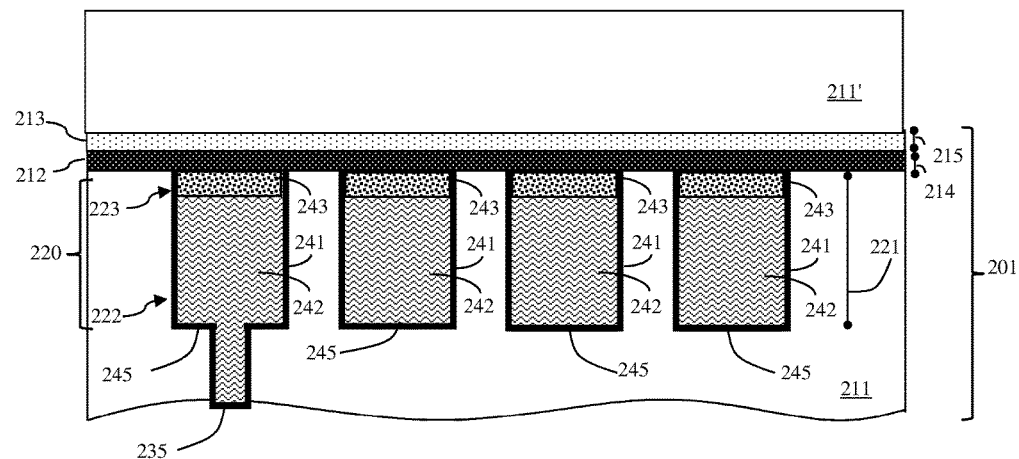
FIG. 9 is a cross-section diagram illustrating a partially completed structure formed according to the method of FIG. 1.
Figure 10:
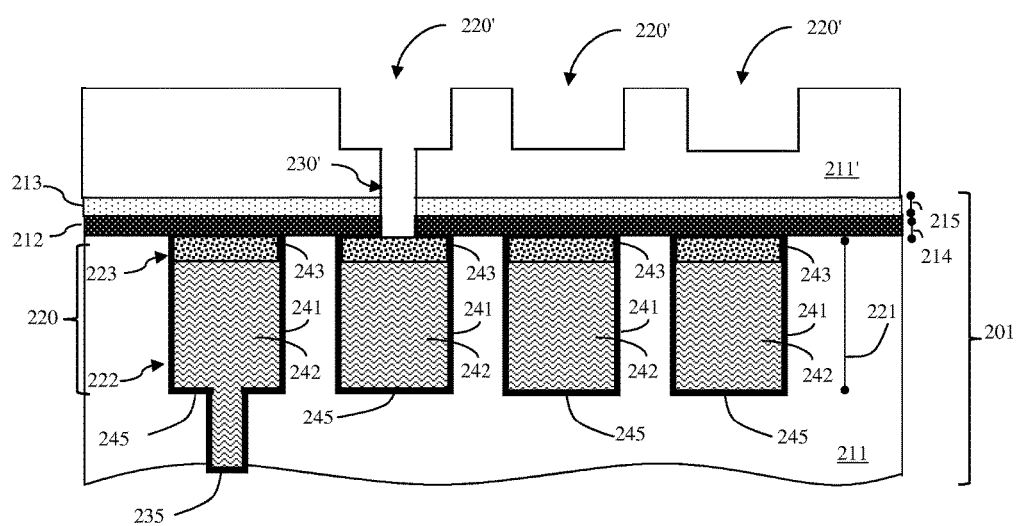
FIG. 10 is a cross-section diagram illustrating a partially completed structure formed according to the method of FIG. 1; and, FIG. 11 is a cross-section diagram illustrating a structure formed according to the method of FIG. 1.
Figure 11:
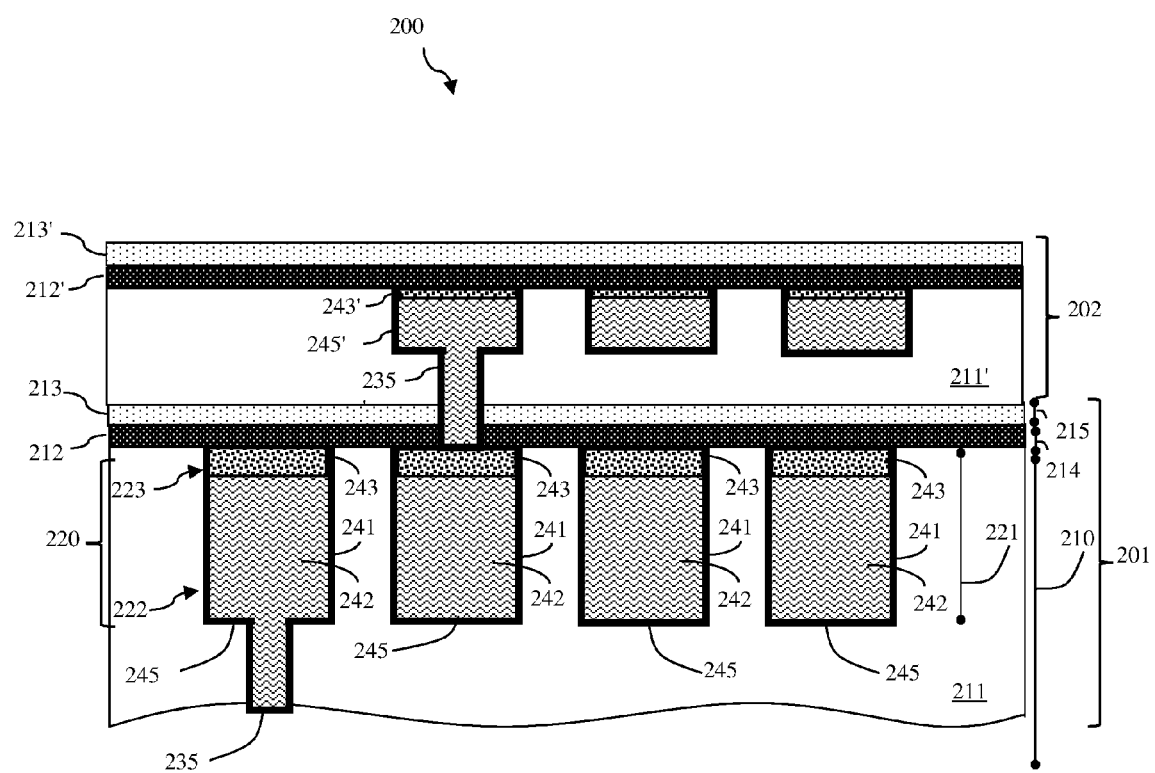

After the third dielectric layer 213 is formed, an additional metal level 202 can be formed on this third dielectric layer 213 (116, see FIGS. 9-11).

Specifically, an additional first dielectric layer 211' can be formed immediately adjacent to the third dielectric layer 213 (see FIG. 9). This additional first dielectric layer 211' can be formed using a PECVD process, such as an HDPCVD process, a spin coating process or any other suitable deposition process. This additional first dielectric layer 211' can comprise, for example, a silicon dioxide (SiO$_2$) layer or any other suitable interlayer dielectric material (e.g., borophosphosilicate glass (BPS G), tetraethyl orthosilicate (TEOS), fluorinated tetraethyl orthosilicate (FTEOS), etc.). This additional first dielectric layer 211' can be deposited such that it has the same the thickness as the first dielectric layer 211 or a different thickness, which is still greater than the thickness of the third dielectric layer 213 below.

Then, damascene and/or dual-damascene techniques can be used to form one or more additional trenches 220' (i.e., wiring grooves) and, optionally, one or more additional via openings 230' (see FIG. 10). Specifically, additional trench(es) 220' can be formed that extending vertically a predetermined depth into the additional first dielectric layer 211' in order to accommodate a metal wire of a given thickness. Each additional via opening 230' can be formed so as to extend vertically from a bottom of an additional trench 220' through a lower portion of the additional first dielectric layer 211', through the third dielectric layer 213 and through the second dielectric layer 212 to a metal wire 245 in the metal level 201 below.

Once the additional trench(es) 220' and any additional via opening(s) 230' are formed, additional processing can proceed in essentially the same manner as described above with regard to process steps 108-112 and, optionally, with regard to process step 114. That is, the additional trench(es) 220' and any additional via opening(s) 230' can optionally be lined with a conductive diffusion barrier layer and filled with an additional metal material (e.g., to form additional metal wire(s) 245' and, if applicable, additional connecting via(s) 235'). The additional metal material can be the same metal as that used to form the metal wires 245 (e.g., copper) or, alternatively, can be any other suitable metal material (e.g., aluminum, tungsten, etc.). Following deposition of the additional metal material, a CMP process can be performed to remove all conductive material from the top surface of the additional first dielectric layer 211'.

Next, an additional second dielectric layer 212' (e.g., an additional dielectric capping layer, such as a silicon nitride layer) can be formed on the additional first dielectric layer 211' and self-aligned metal silicide layer(s) 243' can concurrently be formed in the upper portion(s) of the additional trench(es) 243' at the interfaces between the additional metal wire(s) 245' and the additional second dielectric layer 245'. The additional second dielectric layer 212' can be relatively thin (e.g., 20-200 nm or, more particularly, 50-70 nm). It should be noted that, if the additional metal wire(s) 245' are relatively thick (e.g., 1-3 µm), this additional second dielectric layer 212' can be deposited using a PECVD technique, wherein the settings on that PECVD tool are selectively adjusted based on the pattern density of the additional metal wires 245' in order to ensure that the additional metal wires 245' achieve a desired temperature and, thereby to ensure that the additional self-aligned metal silicide layer(s) 243' having a desired thickness.

Furthermore, if the additional metal wire(s) 245' are relatively thick (e.g., 1-3 µm), an additional third dielectric layer 213', which is relatively thin (e.g., 20-200 nm or, more particularly, 50-70 nm), can be formed on the additional second dielectric layer 212' to reduce the tensile stress of the additional metal wire(s) prior to formation of any other metal levels thereon (see FIG. 11).

Referring to FIG. 11, also disclosed herein are embodiments of an IC chip 200 that is formed using the above described method and that thereby has a BEOL metal level 201 with improved dielectric capping layer to metal wire adhesion.

Specifically, the IC chip structure 200 can comprise a substrate and an IC device layer above the substrate. The IC chip structure 200 can further comprise a metal level 201, with relatively thick metal wire(s) 245, above the device layer and, thereby above the substrate. It should be noted that this metal level 201 can be the first metal level (i.e., M-1) above the device layer or some other metal level above the device layer.

In any case, this metal level 201 can comprise a first dielectric layer 211. This first dielectric layer 211 can comprise, for example, a silicon dioxide ($SiO_2$) layer or any other suitable interlayer dielectric material (e.g., borophosphosilicate glass (BPS G), tetraethyl orthosilicate (TEOS), fluorinated tetraethyl orthosilicate (FTEOS), etc.). This first dielectric layer 211 can have a first thickness 210, which ranges, for example, from 1-8 μm such that it can accommodate relatively thick metal wire(s) 245 (e.g., metal wire(s) having a thickness of 1-8 μm, as discussed in greater detail below).

The metal level 201 can further comprise one or more trenches 220 (i.e., wiring grooves) and, optionally, one or more via openings 230. Specifically, the trench(es) 220 can be in an upper portion of the first dielectric layer 211 and can extend vertically a predetermined depth 221 into the first dielectric layer 211 from the top surface of the first dielectric layer 211. Each via opening 230 can extend vertically from a bottom of a trench 220 to a lower metal level or to the device layer (not shown). The trench(es) 220 and any via opening(s) 230 can optionally be lined with a conductive diffusion barrier layer 241. That is, any suitable conductive material that exhibits high atomic diffusion resistance (i.e., a conductive diffusion barrier material that exhibits low atomic diffusivity) can line the bottom surface and sidewalls of the trench(es) 220 and any via opening(s) 230. Such a conductive diffusion barrier layer 241 can have a thickness ranging, for example, from 200-2000 Angstroms and can comprise a cobalt layer, a chromium layer, a ruthenium layer, a tantalum layer, a tantalum nitride layer, an indium oxide layer, a tungsten layer, a tungsten nitride layer, a titanium layer, a titanium nitride layer, or any other suitable conductive barrier material as described above. Any via opening(s) 230 and at least the lower portion(s) 222 of the trench(es) 220 can be filled with a metal material 242, thereby forming relatively thick metal wire(s) 245 and, if applicable, connecting via(s) 235. This metal material can comprise, for example, copper. Alternatively, the metal material can comprise any suitable metal material for metal level wire formation. In any case, the metal wire(s), which as discussed above are relatively thick due to the depth of the trench(es), can comprise connecting wires or, alternatively, can comprise passive devices, such as inductors or resistors, or components thereof, which have been incorporated into the IC chip design.

The metal level 201 can further comprise self-aligned metal silicide layer(s) 243 (e.g., self-aligned copper silicide layers when the metal wire(s) 245 are copper wire(s)). The self-aligned metal silicide layer(s) 243 can be in the upper portion(s) 223 of the trench(es) 220 above and immediately adjacent to the metal wire(s) 245 (e.g., immediately adjacent to copper wire(s)). The self-aligned metal silicide layer(s) 243 can be relatively thick. That is, the self-aligned metal silicide layer(s) 243 can have a thickness 244 that is 1-3% of the depth 221 of the trench(es) 220. For example, self-aligned copper silicide layer(s) 243 that is/are 30-90 nm thick can be in upper portion(s) 223 of deep trench(es) 220 (e.g., trenches that are 3 μm deep) above and immediately adjacent to copper metal wire(s) 245.

The metal level 201 can further comprise a second dielectric layer 212 (referred to herein as a dielectric capping layer) on the first dielectric layer 211 and extending laterally over the trench(es) 220 so as to be immediately adjacent to the self-aligned metal silicide layer(s) 243. The second dielectric layer 212 can comprise, for example, a silicon nitride layer, a silicon oxynitride layer, or any other suitable dielectric capping layer. The second dielectric layer 212 can have a second thickness 214. This second thickness 214 can be less than the depth 221 of the trench(es) 220 and, thereby less than the thickness of the first dielectric layer 211. For example, the second thickness 214 can be less than 20% and, more particularly, less than 10% of the depth 221 of the trench(es) 220. For example, the second thickness 214 of the second dielectric layer 212 can range from 20-200 nm or, more particularly, from 50-70 nm.

The metal level 201 can further comprise third dielectric layer 213 on the second dielectric layer 212. The third dielectric layer 213 can comprise, for example, a different dielectric material than that used for the second dielectric layer 212. For example, the third dielectric layer 213 can comprise a silicon oxide layer, a silicon oxynitride layer, a hydrogenated silicon oxycarbide layer, etc. Alternatively, this third dielectric layer 213 can comprise the same dielectric material as the second dielectric layer 212. In any case, this third dielectric layer 213 can have a third thickness 215. This third thickness 215 can be less than the depth 221 of the trench(es) 220 and, thereby less than the thickness of the first dielectric layer 211. This third thickness 215 can be approximately equal to the second thickness 214 of the second dielectric layer 212, slightly thicker than the second thickness 214 of the second dielectric layer 212, or slightly thicker than the second thickness 214 of the second dielectric layer 212. Thus, for example, the third thickness 215 of the third dielectric layer 213 can be less than 20% and, more particularly, less than 10% of the depth 221 of the trench(es) 220. For example, the third thickness 215 of the third dielectric layer 213 can range from 20-200 nm or, more particularly, from 50-70 nm.

The IC structure 200 can further comprise an additional metal level 202 on the third dielectric layer 213. It should be noted that the thin third dielectric layer 213 is thin enough to be flexible during processing prior to formation of the additional metal level 202, thereby allowing the metal wire(s) 245 below to expand and contract without significant opposing forces being exerted at the interface(s) between the second dielectric layer 212 and the metal wire(s) 245. Thus, formation of this third dielectric layer during processing minimizes delamination of the second dielectric layer 212 from the metal wire(s) 245 below.

In any case, the additional metal level 202 can comprise an additional first dielectric layer 211'. This additional first dielectric layer 211' can comprise, for example, a silicon dioxide ($SiO_2$) layer or any other suitable interlayer dielectric material (e.g., borophosphosilicate glass (BPS G), tetraethyl orthosilicate (TEOS), fluorinated tetraethyl orthosilicate (FTEOS), etc.). This additional first dielectric layer 211' can have the same thickness as the first dielectric layer 211 or a different thickness, which is still greater than the thickness of the third dielectric layer 213 below.

The additional metal level 202 can further comprise one or more additional trenches 220' (i.e., wiring grooves) that extend vertically a predetermined depth into the additional first dielectric layer 211' and, optionally, one or more additional via openings 230', wherein each via opening extends vertically from a bottom of an additional trench 220' through a lower portion of the additional first dielectric layer 211', through the third dielectric layer 213 and through the second dielectric layer 212 to a metal wire 245 in the metal level 201 below. The additional trench(es) 220' and any additional via opening(s) 230' can optionally be lined with a conductive diffusion barrier layer. An additional metal material can fill any additional via openings 230', thereby forming connecting vias 235', and can further fill at least the lower portion(s) of the additional trench(es) 220', thereby forming additional metal wire(s) 245'. The additional metal material can be the same metal material as used in the metal wires 245 (e.g., copper) or, alternatively, can be any other suitable metal material (e.g., aluminum, tungsten, etc.).

The additional metal level 202 can further comprise additional self-aligned metal silicide layer(s) 243' in the upper portion(s) of the additional trench(es) 220' above and immediately adjacent to the additional metal wire(s) 245'. The additional self-aligned additional metal silicide layer(s) 243' can be relatively thick. For example, the additional self-aligned metal silicide layer(s) 243' can have a thickness that is 1-3% of the depth of the trench(es) 220.

The additional metal level 202 can further comprise an additional second dielectric layer 212' (referred to herein as an additional dielectric capping layer) on the additional first dielectric layer 211' and extending laterally over the additional trench(es) 220' so as to be immediately adjacent to the additional self-aligned metal silicide layer(s) 243'. The additional second dielectric layer 212' can comprise, for example, a silicon nitride layer, a silicon oxynitride layer, or any other suitable dielectric capping layer. The additional second dielectric layer 212' can be relatively thin (e.g., 20-200 nm or, more particularly, 50-70 nm). It should be noted that, if the additional metal wire(s) 245' are relatively thick (e.g., 1-3 µm), this additional second dielectric layer 212' can be deposited using a PECVD technique, wherein the settings on that PECVD tool are selectively adjusted based on the pattern density of the additional metal wires 245' in order to ensure that the additional metal wires 245' achieve a desired temperature and, thereby to ensure that the self-aligned metal silicide layer(s) 243' having a desired thickness.

Optionally, if the additional metal wire(s) 245' are relatively thick (e.g., 1-3 µm), the additional metal level 202 can further comprise an additional third dielectric layer 213'. This additional third dielectric layer 213' can be above and immediately adjacent to the additional second dielectric layer 212' and below any upper metal levels. This additional third dielectric layer 213' can be relatively thin (e.g., 20-200 nm or, more particularly, 50-70 nm).

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed method and structure and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

Therefore, disclosed above are embodiments of a method of forming back end of the line (BEOL) metal levels with improved dielectric capping layer to metal wire adhesion. The embodiments include one or more process steps that are designed to address dielectric capping layer to metal wire adhesion, when the metal wire(s) in a given metal level are relatively thick (e.g., >1 µm, >2 µm, >3 µm, etc.). These process steps can include, for example: (1) selective adjustment of the deposition tool that is used to deposit the dielectric capping layer onto metal wires based on the pattern density of the metal wires in order to ensure that those metal wires actually achieve a temperature between 360° C.-400° C.; and/or (2) deposition of a relatively thin dielectric layer onto the dielectric capping layer prior to formation of the next metal level in order to reduce the tensile stress of the metal wire(s) below without causing delamination. Also disclosed above are embodiments of an IC chip that is formed using the above described method embodiments and that thereby has a BEOL metal level with improved dielectric capping layer to metal wire adhesion.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
forming a metal level above a substrate, the forming of the metal level comprising:
    forming a first dielectric layer above the substrate, the first dielectric layer having a first thickness;
    forming trenches in the first dielectric layer;
    filling the trenches with copper to form copper wires;
    forming a second dielectric layer immediately adjacent to the first dielectric layer and the copper wires,
        the second dielectric layer having a second thickness and comprising a silicon nitride layer, and
        the forming of the second dielectric layer being performed using a plasma-enhanced chemical vapor deposition process that results in self-aligned copper silicide layers being formed at interfaces between the silicon nitride layer and the copper wires; and,
    forming a third dielectric layer on the second dielectric layer,
        the third dielectric layer having a third thickness, and
        the first thickness being greater than the second thickness and the third thickness; and,
    forming an additional metal level on the third dielectric layer.

2. The method of claim 1, the third thickness being less than the second thickness.

3. The method of claim 1, the plasma-enhanced chemical vapor deposition process being performed so that, during the forming of the second dielectric layer, the copper wires are heated to a temperature of at least 360° C.

4. The method of claim 1, the third dielectric layer comprising a silicon oxide layer.

5. The method of claim 1,
the trenches containing the copper wires having a depth that is approximately 3 microns,
the second thickness and the third thickness each being less than 10% of the depth, and
the self-aligned copper silicide layers each having a fourth thickness that is approximately 1-3% of the depth.

6. The method of claim 1, the forming of the additional metal level comprising:
    forming an additional first dielectric layer immediately adjacent to the third dielectric layer, the additional first dielectric layer being thicker than the second dielectric layer and the third dielectric layer;
    forming an additional trench in an upper portion of the additional first dielectric layer and a via opening that extends vertically from the additional trench through a lower portion of the additional first dielectric layer, through the third dielectric layer and through the second dielectric layer to one of the copper wires;
    filling the additional trench and the via opening with an additional metal material; and
    forming an additional second dielectric layer on the additional first dielectric.

7. A method comprising:
forming a metal level above a substrate, the forming of the metal level comprising:
    forming a first dielectric layer above the substrate, the first dielectric layer having a first thickness;
    forming trenches in the first dielectric layer;
    filling the trenches with copper to form copper wires;
    forming a second dielectric layer above and immediately adjacent to the first dielectric layer and further above and immediately adjacent to the copper wires,
        the second dielectric layer having a second thickness and comprising a silicon nitride layer, and
        the forming of the second dielectric layer being performed using a plasma-enhanced chemical vapor deposition process, which has a plasma exposure time that is set based on a pattern density of the copper wires and which results in self-aligned copper silicide layers being formed at interfaces between the silicon nitride layer and the copper wires; and,
    forming a third dielectric layer on the second dielectric layer,
        the third dielectric layer having a third thickness, and
        the first thickness being greater than the second thickness and the third thickness; and,
    forming an additional metal level on the third dielectric layer.

8. The method of claim 7, the third thickness being less than the second thickness.

9. The method of claim 7, the plasma exposure time being set prior to the forming of the second dielectric layer using a look-up table that specifies different exposure times for different pattern density ranges for the copper wires so that, during the forming of the second dielectric layer, the copper wires are heated to a temperature of at least 360° C. and not greater than 400° C.

10. The method of claim 9, the look-up table specifying at least a first plasma exposure time for a first pattern density range and a second plasma exposure time for a second pattern density range that is greater than the first pattern density range, the second plasma exposure time being greater than the first plasma exposure time.

11. The method of claim 7, the third dielectric layer comprising a silicon oxide layer.

12. The method of claim 7,
the trenches containing the copper wires having a depth that is approximately 3 microns,
the second thickness and the third thickness each being less than 10% of the depth, and
the self-aligned copper silicide layers each having a fourth thickness that is approximately 1-3% of the depth.

13. The method of claim 7, the forming of the additional metal level comprising:
    forming an additional first dielectric layer immediately adjacent to the third dielectric layer, the additional first dielectric layer being thicker than the second dielectric layer and the third dielectric layer;
    forming at least one additional trench in an upper portion of the additional first dielectric layer and at least one via opening that extends vertically from the additional trench through a lower portion of the additional first dielectric layer, through the third dielectric layer and through the second dielectric layer to one of the copper wires;
    filling the additional trench and the via opening with an additional metal material; and
    forming an additional second dielectric layer on the additional first dielectric.

14. The method of claim 13, the additional metal material being any of aluminum and tungsten.

* * * * *